United States Patent
Saenger et al.

(10) Patent No.: US 9,946,161 B2
(45) Date of Patent: Apr. 17, 2018

(54) OPTICAL SYSTEM FOR A MICROLITHOGRAPHIC PROJECTION EXPOSURE APPARATUS AND MICROLITHOGRAPHIC EXPOSURE METHOD

(71) Applicant: Carl Zeiss SMT GmbH, Oberkochen (DE)

(72) Inventors: Ingo Saenger, Heidenheim (DE); Ralf Scharnweber, Aalen (DE); Olaf Dittmann, Bopfingen (DE); Toralf Gruner, Aalen-Hofen (DE); Gundula Weiss, Aalen (DE); Andras G. Major, Oberkochen (DE); Martin Vogt, Mutlangen (DE); Markus Deguenther, Aalen (DE); Johannes Wangler, Koenigsbronn (DE); Thomas Korb, Schwaebisch Gmuend (DE); Severin Waldis, Bern (CH)

(73) Assignee: Carl Zeiss SMT GmbH, Oberkochen (DE)

( * ) Notice: Subject to any disclaimer, the term of this patent is extended or adjusted under 35 U.S.C. 154(b) by 1365 days.

(21) Appl. No.: 13/660,146

(22) Filed: Oct. 25, 2012

(65) Prior Publication Data
US 2013/0077077 A1    Mar. 28, 2013

Related U.S. Application Data

(63) Continuation of application No. PCT/EP2011/056830, filed on Apr. 29, 2011.
(Continued)

(30) Foreign Application Priority Data

May 27, 2010    (DE) .................. 10 2010 029 339

(51) Int. Cl.
*G03B 27/72* (2006.01)
*G03F 7/20* (2006.01)

(52) U.S. Cl.
CPC ...... *G03F 7/70116* (2013.01); *G03F 7/70566* (2013.01)

(58) Field of Classification Search
CPC ..................... G03F 7/70566; G03F 7/70116
See application file for complete search history.

(56) References Cited

U.S. PATENT DOCUMENTS 6,191,880 B1    2/2001    Schuster
7,525,642 B2 *  4/2009    Mulder ............... G03F 7/70116
                                                355/53
(Continued)

FOREIGN PATENT DOCUMENTS

DE    10 2004 011 733 A1    9/2005
DE    10 2006 038 643 A1    2/2008
(Continued)

OTHER PUBLICATIONS

German Office Action, with English translation, for corresponding DE Appl No. 10 2010 029 339.51, dated Jan. 11, 2011.
(Continued)

*Primary Examiner* — Chia-How Michael Liu
(74) *Attorney, Agent, or Firm* — Fish & Richardson P.C.

(57) ABSTRACT

An optical system for a microlithographic projection exposure apparatus and a microlithographic exposure method are disclosed. In an embodiment an optical system for a microlithographic projection exposure apparatus includes at least one mirror arrangement having a plurality of mirror elements which are displaceable independently of each other for altering an angular distribution of the light reflected by the mirror arrangement. The optical system also includes at least one manipulator downstream of the mirror arrangement
(Continued)

in the light propagation direction. The manipulator has a raster arrangement of manipulator elements so that light incident on the manipulator during operation of the optical system is influenced differently in its polarization state and/or in its intensity in dependence on the incidence location.

27 Claims, 11 Drawing Sheets

Related U.S. Application Data

(60) Provisional application No. 61/348,798, filed on May 27, 2010.

(56) References Cited

U.S. PATENT DOCUMENTS

| | | | |
|---|---|---|---|
| 2002/0176166 | A1 | 11/2002 | Schuster |
| 2004/0184019 | A1 | 9/2004 | Totzeck et al. |
| 2007/0146676 | A1 | 6/2007 | Tanitsu |
| 2007/0195305 | A1 | 8/2007 | Mulder et al. |
| 2007/0279613 | A1 | 12/2007 | Fiolka et al. |
| 2008/0013065 | A1 | 1/2008 | Kohl |
| 2009/0040498 | A1 | 2/2009 | Mengel |
| 2009/0135397 | A1 | 5/2009 | Fiolka |
| 2009/0279066 | A1 | 11/2009 | Tinnemans et al. |
| 2010/0149504 | A1 | 6/2010 | Deguenther |
| 2011/0063597 | A1 | 3/2011 | Mengel |
| 2011/0194093 | A1 | 8/2011 | Saenger |
| 2011/0228247 | A1 | 9/2011 | Mulder et al. |

FOREIGN PATENT DOCUMENTS

| | | | |
|---|---|---|---|
| DE | 10 2008 009 601 A1 | | 8/2009 |
| DE | 10 2008 054 844 A1 | | 7/2010 |
| DE | 10 2009 030 230 A1 | | 12/2010 |
| EP | 1 826 616 A2 | | 8/2007 |
| EP | 1 879 071 A2 | | 1/2008 |
| JP | 2007-180088 | | 7/2007 |
| JP | 2007-227918 | | 9/2007 |
| JP | 2009-272624 | | 11/2009 |
| JP | 2010-087389 | | 4/2010 |
| WO | WO 2005/026843 | | 3/2005 |
| WO | WO 2005/031467 A2 | | 4/2005 |
| WO | WO 2005/069081 A2 | | 7/2005 |
| WO | WO 2005/085955 | | 9/2005 |
| WO | WO 2008/019936 A2 | | 2/2008 |
| WO | WO 2009/034109 A2 | | 3/2009 |
| WO | WO 2009/060773 | | 5/2009 |
| WO | WO 2009/100862 A1 | | 8/2009 |
| WO | WO 2010/149436 | | 12/2010 |

OTHER PUBLICATIONS

The International Preliminary Report on Patentability for corresponding PCT Appl No. PCT/EP2011/056830, dated Nov. 27, 2012.
Japanese Office Action, with translation thereof, for corresponding JP Appl No. 2013-511593, dated Jan. 30, 2014.
European Office Action for corresponding EP Appl No. 11720415.6, dated Apr. 24, 2014.
Korean Office Action, with translation thereof, for KR Appl No. 10-2012-7033984, dated Jul. 28, 2014.
European Office Action and summons for oral proceedings for corresponding EP Appl No. EP2577399, dated Mar. 18, 2016.
European Office Action for corresponding EP 11720415.6, dated Oct. 10, 2016.
The International Search Report and Written Opinion for corresponding PCT Appl No. PCT/EP2011/056830, dated Sep. 26, 2011.
Japanese Office Action, with translation thereof, for JP Appl. No. 2013-511593, dated May 2, 2014.

* cited by examiner

OPTICAL SYSTEM FOR A MICROLITHOGRAPHIC PROJECTION EXPOSURE APPARATUS AND MICROLITHOGRAPHIC EXPOSURE METHOD

CROSS REFERENCE TO RELATED APPLICATIONS

This application is a continuation of, and claims benefit under 35 USC 120 to, international application PCT/EP2011/056830, filed Apr. 29, 2011, which claims benefit under 35 USC 119 of German Application No. 10 2010 029 339.3 and under 35 USC 119(e) of US 61/348,798, both filed on May 27, 2010. International application PCT/EP2011/056830 is incorporated by reference herein in its entirety.

FIELD

The disclosure concerns an optical system for a microlithographic projection exposure apparatus and a microlithographic exposure method.

BACKGROUND

Microlithographic projection exposure apparatuses are used for the production of microstructured components such as for example integrated circuits or LCDs. Such a projection exposure apparatus has an illumination system and a projection objective. In the microlithography process the image of a mask (=reticle) illuminated via the illumination system is projected via the projection objective on to a substrate (for example a silicon wafer) which is coated with a light-sensitive layer (photoresist) and arranged in the image plane of the projection objective to transfer the mask structure on to the light-sensitive coating on the substrate.

During operation of a microlithographic projection exposure apparatus it is desirable to set defined illumination settings, that is to say intensity distributions in a pupil plane of the illumination system, in specifically targeted fashion. For that purpose, besides the use of diffractive optical elements (so-called DOEs), the use of mirror arrangements is also known, for example from WO 2005/026843 A2. Such mirror arrangements include a plurality of micromirrors adjustable independently of each other.

Various approaches are also known for setting polarization distributions in the pupil plane and/or in the reticle in the illumination system for optimising imaging contrast in specifically targeted fashion. Examples are disclosed in WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, DE 10 2008 009 601 A1 and DE 10 2004 011 733 A1.

SUMMARY

The disclosure provides an optical system for a microlithographic projection exposure apparatus, which permits enhanced flexibility with respect to the intensity and/or polarization distributions which can be set in the projection exposure apparatus.

An optical system according to the disclosure for a microlithographic projection exposure apparatus includes:

at least one mirror arrangement having a plurality of mirror elements which are displaceable independently of each other for altering an angular distribution of the light reflected by the mirror arrangement; and at least one manipulator which is arranged downstream of the mirror arrangement in the light propagation direction and has a raster arrangement of manipulator elements so that light incident on the manipulator in operation of the optical system is influenced differently in its polarization state and/or in its intensity in dependence on the incidence location;

wherein at least two mutually different illumination settings are adjustable by the variation in an angular distribution of the light reflected by the mirror arrangement, wherein the illumination settings differ from each other in that identical regions of a pupil plane of the illumination system are illuminated with light of a different polarization state; and a period length of the periodically alternating arrangement in a given spatial direction corresponds to a period length of the mirror arrangement in that spatial direction or to an integral multiple of the period length in that spatial direction.

In accordance with the present disclosure the expression "raster arrangement" of manipulator elements is used to denote an arrangement made up of at least four manipulator elements, wherein at least two of the manipulator elements are respectively arranged in mutually adjacent relationship in each of two mutually perpendicular spatial directions within the plane of the arrangement. In that respect the "raster arrangement" according to the disclosure is not limited to periodic or equidistant arrangements, that is to say the manipulator elements which follow each other in each of the two spatial directions (for example the x- and y-directions) can in principle be of any desired configuration (that is to say also aperiodic) with respect to the maximum extent of the manipulator elements. In addition the individual manipulator elements can be of a square, rectangular or also other suitable geometry with respect to their optically used effective surface. On the other hand the manipulator elements can also be arranged (partially or entirely) periodically with respect to their extent in at least one of the mutually perpendicular spatial directions. Further (without the disclosure being restricted thereto) the manipulator elements of a mirror arrangement may each involve identical dimensions or identical cross-section.

Although a minimum number of four manipulator elements in the raster arrangement is mentioned above, a raster arrangement typically has substantially more manipulator elements, without however the disclosure being restricted thereto. In particular in embodiments of the disclosure the number of manipulator elements of the manipulator can be at least 10, such as at least 30 or at least 100.

The manipulator being downstream of the mirror arrangement in the light propagation direction means that mirror elements can be directed in specifically targeted fashion onto individual regions or polarizer elements of the manipulator.

As is also described in greater detail below, the manipulator elements of the raster arrangement can be displaceable in their position and/or switchable in their polarization-influencing effect.

The combination of a manipulator including an arrangement of manipulator elements and a mirror arrangement including a plurality of mutually independently adjustable mirror elements on the other hand makes it possible to subject individual beam portions of the illumination light to respectively different variations in their polarization state or their intensity and also at the same time to adjust the mirror elements that matched to the change in the polarization state and/or intensity so that the light is deflected by the mirror arrangement into a respectively "suitable" direction, or a direction which is appropriate for producing a desired (optionally polarized) illumination setting, typically into given regions of a subsequent pupil plane.

In particular it is possible, for example upon use in an illumination system of a projection exposure apparatus, to adjust different illumination settings by the illumination of different subregions of the manipulator.

According to another aspect, an optical system according to the disclosure for a microlithographic projection exposure apparatus includes:

at least one mirror arrangement having a plurality of mirror elements which are displaceable independently of each other for altering an angular distribution of the light reflected by the mirror arrangement; and at least one manipulator which is arranged downstream of the mirror arrangement in the light propagation direction and has a raster arrangement of manipulator elements in such a way that light incident on the manipulator in operation of the optical system is influenced differently in its polarization state and/or in its intensity in dependence on the incidence location.

In an embodiment of the disclosure, at least one of the manipulator elements is a Kerr cell or a Pockels cell. In that respect, the disclosure is not limited to the arrangement of the manipulator downstream of the mirror arrangement in the light propagation direction. Rather, as an alternative the manipulator can also be arranged upstream of the mirror arrangement in the light propagation direction, or a manipulator can be provided upstream of the mirror arrangement in the beam path and a further manipulator can be provided downstream of the mirror arrangement.

In a further aspect, the disclosure concerns an optical system for a microlithographic projection exposure apparatus including:

at least one mirror arrangement having a plurality of mirror elements which are displaceable independently of each other for altering an angular distribution of the light reflected by the mirror arrangement; and at least one manipulator which has a raster arrangement of manipulator elements in such a way that light incident on the manipulator in operation of the optical system is influenced differently in its polarization state in dependence on the incidence location;

wherein at least one of the manipulator elements is a Kerr cell or a Pockels cell.

In certain embodiments: when the mirror elements are arranged in a first configuration, light reflected by the mirror arrangement results in a first illumination setting in the pupil plane; when the mirror elements are arranged in a second configuration, light reflected by the mirror arrangement results in a second illumination setting in the pupil plane; the second illumination setting in the pupil plane is different from the first illumination setting in the pupil plane; the first and second illumination settings illuminate identical regions of the pupil plane; and a polarization state of the light in the pupil plane in the first illumination setting is different from a polarization state of the light in the pupil plane in the second illumination setting. The first and second illumination settings differ from each other in that identical regions of the pupil plane are illuminated with different intensities. The first illumination setting is a dipole illumination setting, a quadrupole illumination setting, an annular illumination setting, or a conventional illumination setting.

As a consequence of the displaceability of the mirror elements and possibly also the manipulator, in embodiments of the disclosure it is also possible to implement rapid switching-over between different illumination settings without interchange of polarization- or intensity-influencing elements being desired for that purpose in the optical system.

A possible application of the concept according to the disclosure is that of adjusting a given illumination setting with the mirror arrangement and compensating for an unwanted polarization effect on the part of the mirror elements of the mirror arrangement by way of the manipulator (in the form of a polarization manipulator) so that in that case the manipulator is used as a "correction plate" for the purposes of achieving an overall polarization-neutral action on the part of the combination of manipulator and mirror arrangement.

A further application of the concept according to the disclosure involves specifically targeted implementation of a given polarization and/or intensity distribution (that is to say achieving a contribution which overall is not vanishingly small with respect to polarization and/or intensity distribution). It is possible in that way on the one hand to compensate for troubles present elsewhere in the system. In addition the process window can also be further enlarged with respect to a given exposure step by optimising the proportion of useful light contributing to imaging contrast, by virtue of a specifically targeted polarization distribution.

Illumination of the polarizer elements or the actuation of the mirror elements can be effected in dependence on a measurement of polarization distribution and/or intensity distribution, previously carried out in a field or pupil plane, to achieve an approximation to a predetermined target state.

A further application of the concept of the disclosure involves adapting the imaging properties of different systems to each other, by a procedure whereby for example at least one of two different projection exposure apparatuses is so modified that the combination of illumination system, reticle and projection objective on the wafer plane affords in the ideal case the same imaging result upon a change between the two systems (referred to as "matching").

In a preferred embodiment of the disclosure the mirror arrangement and the manipulator are disposed at positions in which the paraxial subaperture ratios differ from each other by a maximum of 0.15, preferably a maximum of 0.10. In that case the paraxial subaperture ratio S is defined as:

$$S = \frac{r}{|h| + |r|} \operatorname{sgn} h \tag{1}$$

wherein r denotes the paraxial marginal ray height and h denotes the paraxial principal ray height. The so-called signum function is denoted by sgn (x), wherein by definition it is possible to set sgn(0)=1. A definition of the paraxial marginal ray and the paraxial principal ray is to be found in "Fundamental Optical Design" by Michael J Kidger, SPIE PRESS, Bellingham, Wash., USA.

The term principal ray is used to denote a ray from an object point which is at the greatest spacing relative to the optical axis in the object plane and which intersects the optical axis in the pupil plane. The term marginal ray is used to denote a ray from the point of intersection of the object field plane with the optical axis, the ray passing through the margin of the aperture stop at maximum aperture opening. In the case of off-axis object fields this involves a notional ray which does not contribute to imaging of the object in the image space.

The paraxial subaperture ratio S represents a signed parameter which is a measurement with respect to field or pupil proximity of a plane in the optical system. In that respect by definition the subaperture ratio is standardised to values between −1 and +1, wherein a zero of the paraxial subaperture ratio corresponds to each field plane and wherein a discontinuity location with a jump of the paraxial subaperture ratio from −1 to +1 or from +1 to −1 corresponds to each pupil plane. Accordingly planes with a paraxial subaperture ratio of at least 0.8 represent planes near the pupil, whereas planes with a paraxial subaperture ratio of a maximum of 0.2 represent planes near the field. In that respect the sign of the paraxial subaperture ratio specifies the arrangement of the plane in front of or behind a reference plane. For example the sign of the penetration point of a coma ray in the plane in question can be used for definition purposes.

In an embodiment of the disclosure the mirror arrangement and/or the manipulator is arranged at a position in which the paraxial subaperture ratio is greater than 0.8, preferably greater than 0.9, that is to say at a position "near the pupil".

In a further embodiment of the disclosure the mirror arrangement and/or the manipulator is arranged at a position in which the paraxial subaperture ratio is smaller than 0.3, preferably smaller than 0.2, that is to say at a position "near the field".

In an embodiment of the disclosure the optical system has two mirror arrangements each having a plurality of mirror elements which are respectively displaceable independently of each other for altering an angular distribution of the light reflected by the mirror arrangement. In that respect in particular preferably one of those mirror arrangements is arranged in front of the manipulator in relation to the light propagation direction and the other of the mirror arrangements is arranged downstream of the manipulator in relation to the light propagation direction.

That arrangement with two mirror arrangements affords the possibility of guiding each individual light beam in specifically targeted fashion onto a respectively selected manipulator element of the manipulator via the upstream mirror arrangement and thus firstly influencing it with respect to its polarization state and/or its intensity in accordance with the action of that manipulator element. Then the light ray in question, on which the desired polarization state and/or the desired intensity has already been "imposed", can be deflected into the desired direction via the second mirror arrangement. Accordingly therefore, for each individual light ray, both polarization or intensity and also the location to be illuminated by that light ray in the pupil plane can be predetermined independently of each other, thereby further increasing the flexibility with respect to the intensity or polarization distributions which are adjustable in the projection exposure apparatus.

In that respect the disclosure is not limited to the raster configuration of the manipulator (in the above-defined sense). Rather, in embodiments of the disclosure having two mirror arrangements in the above-described structure the manipulator can also be designed in a different way so that light incident on the manipulator is influenced differently in its polarization state and/or its intensity in dependence on the incidence location. For example the manipulator can have a thickness profile which varies (continuously or non-continuously) in the light propagation direction (for example a wedge shape) and can be made from a birefringent or also optically active material (for example crystalline quartz) so that the polarization state is also influenced differently depending on the respective location at which the light passes through or the distance covered in the material. In that respect, to compensate for a ray displacement caused by such a varying thickness profile, a further optical element (of correspondingly complementary geometry, in the case of the wedge shape therefore a corresponding counterpart wedge) can be used, which itself no longer alters the polarization state (and is produced for example from amorphous quartz glass).

In a further aspect the disclosure thus also concerns an optical system for a microlithographic projection exposure apparatus, including
  a manipulator which is of such a configuration that light incident on the manipulator in operation of the optical system is differently influenced in its polarization state and/or in its intensity in dependence on the incidence location;
  and two mirror arrangements which each have a plurality of mirror elements which are displaceable independently of each other for altering an angular distribution of the light reflected by the respective mirror arrangement, wherein the one of the mirror arrangements is arranged upstream of the manipulator in the light propagation direction and wherein the other of the mirror arrangements is arranged downstream of the manipulator in the light propagation direction.

In a further embodiment there is provided at least one position manipulator for changing the position of at least one manipulator element, in particular all manipulator elements. In particular the position manipulator can be adapted to displace and/or exchange one, a plurality of or all of the manipulator elements. That design configuration has the advantage that different distributions of the manipulator elements can be implemented depending on the respective application and thus different polarization and/or intensity distributions can also already be set via the position manipulator.

In an embodiment the maximum extent of the manipulator elements in at least one of two mutually perpendicular spatial directions is at a maximum a tenth, preferably at a maximum a fifteenth, further preferably at a maximum a twentieth of the maximum extent of the optically usable area of the manipulator in the spatial direction. That is advantageous in regard to distribution which is as uniform as possible of different manipulator elements over the raster arrangement so that ideally each of the individual mirror elements can be directed without great deflection out of its position, in relation to the arrangement of the manipulator which follows in the light propagation direction, selectively on to manipulator elements with a different polarization-manipulating and/or intensity-manipulating effect, a suitable manipulator element for the respective mirror element can therefore be so-to-speak "reached" in close proximity with the optimum mirror position. That is also advantageous insofar as a possibly unwanted polarization action on the part of the mirror elements is involved with an angular displacement of the mirror elements.

In an embodiment the arrangement of manipulator elements is such that the manipulator elements cancel each other in their influence on the polarization state when all the optically usable surface of the manipulator is illuminated. Such a configuration is advantageous in regard to the uniform intensity distribution which is generally desired in adjusting an illumination setting, over different illumination poles (for example a dipole or quadrupole illumination setting), with a possibly mutually differing polarization distribution.

In an embodiment at least two mutually different illumination settings can be adjusted by the variation in an angular distribution of the light reflected by the mirror arrangement.

In that case both those illumination settings in which identical regions of the pupil plane are illuminated with light involving a different polarization state or with light involving a different light intensity and also illumination settings in which light of a differing polarization state is deflected into mutually different regions of the pupil plane are considered as differing from each other in their polarization state.

In an embodiment there is provided an actuation unit for actuation of a displacement of mirror elements of the mirror arrangement.

In an embodiment the manipulator elements act as gray filters. In that way—alternatively or additionally to the manipulator being in the form of a polarization manipulator—it is possible to set a specific intensity configuration (or a plurality of different intensity configurations). Although in principle such an effect can already be achieved by use of the mirror arrangement used according to the disclosure (by one or more mirror elements being directed on to given locations in the pupil plane) such a combination as between a mirror arrangement and an arrangement of gray filters is for example meaningful when a desired range of different adjustable intensity distributions can no longer be covered by displaceability of the mirror arrangement alone.

The manipulator elements can have in particular a reflectivity or transmission characteristic which varies in dependence on location over the light beam cross-section (being for example wedge-shaped or linear).

The disclosure further concerns a microlithographic projection exposure apparatus and a microlithographic exposure method in which light produced by a light source of an illumination system is fed to a projection exposure apparatus for illuminating an object plane of a projection objective and in which the object plane is imaged into an image plane of the projection objective via the projection objective, wherein a manipulator having a raster arrangement of manipulator elements is used in the illumination system and wherein at least two mutually different illumination settings can be adjusted by illumination of different subregions of the manipulator.

Further configurations of the disclosure are to be found in the description and the appendant claims.

BRIEF DESCRIPTION OF THE DRAWINGS

The disclosure is described in greater detail hereinafter with exemplary embodiments illustrated in the accompanying drawings in which.

DETAILED DESCRIPTION OF PREFERRED EMBODIMENTS

Figure 1:
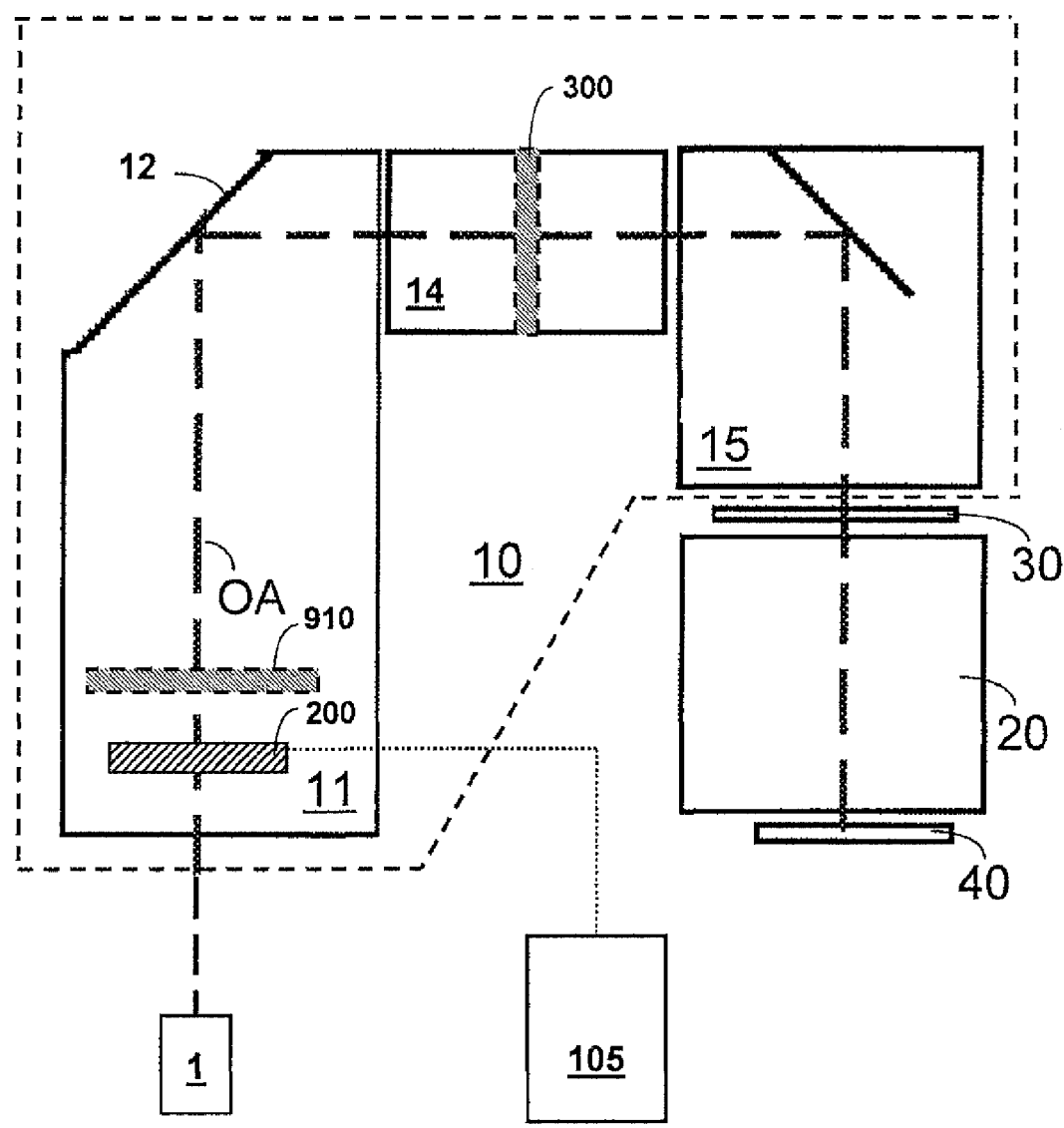
FIG. 1 shows a diagrammatic view to illustrate the structure of a projection exposure apparatus with an optical system according to the disclosure.

A structure in principle of a microlithographic projection exposure apparatus with an optical system according to the disclosure is firstly described hereinafter with reference to FIG. 1. The projection exposure apparatus has an illumination system 10 and a projection objective 20. The illumination system 10 serves to illuminate a structure-bearing mask (reticle) 30 with light from a light source unit 1 which for example includes an ArF-excimer laser for a working wavelength of 193 nm and a beam-shaping optical arrangement producing a parallel light beam. In general the illumination system 10 and the projection objective 20 are designed preferably for a working wavelength of less than 400 nm, in particular less than 250 nm, further particularly less than 200 nm.

According to the disclosure a component part of the illumination system 10 is in particular a mirror arrangement 200 as is described in greater detail hereinafter with reference to FIG. 2. Arranged downstream of the mirror arrangement 200 in the light propagation direction is a manipulator 300 which is described in greater detail hereinafter with reference to FIGS. 3 through 6, wherein the manipulator 300 is disposed as shown in FIG. 1 in the pupil plane or at least in the immediate proximity thereof. The manipulator 300 is thus disposed at a position in which the above-defined paraxial subaperture ratio is greater than 0.8, preferably greater than 0.9.

FIG. 1 also diagrammatically indicates the position of a manipulator 910 which can be used instead of the manipulator 300 and which is described in greater detail hereinafter with reference to FIG. 7 and following.

The illumination system 10 has an optical unit 11 which inter alia in the illustrated example includes a deflection mirror 12. Disposed downstream of the optical unit 11 in the light propagation direction, in the beam path, is a light mixing device (not shown) which for example in per se known manner can have an arrangement of micro-optical elements that is suitable for achieving light mixing, as well as a lens group 14, downstream of which is disposed a field plane having a reticle masking system (REMA) which is imaged through an REMA objective 15 disposed downstream in the light propagation direction, on to the structure-bearing mask (reticle) 30 arranged in a further field plane, and thereby delimits the illuminated region on the reticle. The structure-bearing mask 30 is imaged with the projection objective 20 on to a substrate 40 or a wafer provided with a light-sensitive layer. The projection objective 20 can be designed in particular for the immersion mode of operation. In addition it can have a numerical aperture NA of greater than 0.85, in particular greater than 1.1.

Figure 2:
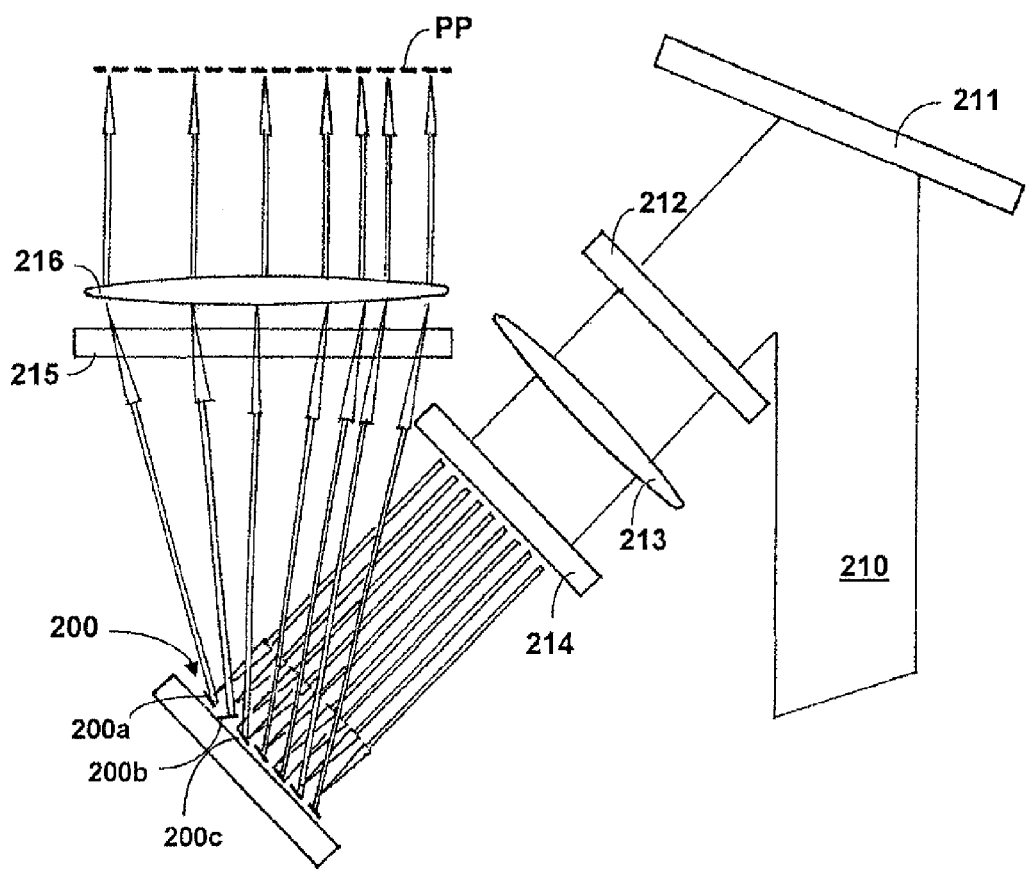
FIG. 2 shows a view to illustrate the structure of a mirror arrangement used in the illumination system of FIG. 1.

In the structure diagrammatically shown in FIG. 2 the mirror arrangement 200 has a plurality of mirror elements 200*a*, 200*b*, 200*c*, . . . . The mirror elements 200*a*, 200*b*, 200*c*, are displaceable independently of each other to alter an angular distribution of the light reflected by the mirror arrangement 200, wherein as shown in FIG. 1 there can be an actuation unit 105 for implementing such displacement (for example by way of suitable actuators).

FIG. 2, to illustrate the structure and function of the mirror arrangement 200 used in accordance with the disclosure in the illumination system 10, shows a structure by way of example of a subregion of the illumination system 10 which in the beam path of a laser beam 210 successively includes a deflection mirror 211, a refractive optical element (ROE) 212, a lens 213 (only shown by way of example), a microlens arrangement 214, the mirror arrangement 200 according to the disclosure, a diffuser 215, a lens 216 and the pupil plane PP. The mirror arrangement 200 includes a plurality of micromirrors 200a, 200b, 200c, . . . , and the microlens arrangement 214 has a plurality of microlenses for targeted focusing on to those micromirrors and for reducing or avoiding illumination of "dead area". The micromirrors 200a, 200b, 200c can be respectively tilted individually, for example, in an angular range of between −2° and +2°, between −5° and +5°, or between −10° and +10°. A desired light distribution, for example an annular illumination setting or also a dipole setting or a quadrupole setting can be produced in the pupil plane PP by a suitable tilting arrangement of the micromirrors 200a, 200b, 200c, . . . in the mirror arrangement 200, insofar as the previously homogenized and collimated laser light is respectively deflected in the desired direction depending on the desired illumination setting by the micromirrors 200a, 200b, 200c, . . . .

Figure 3:
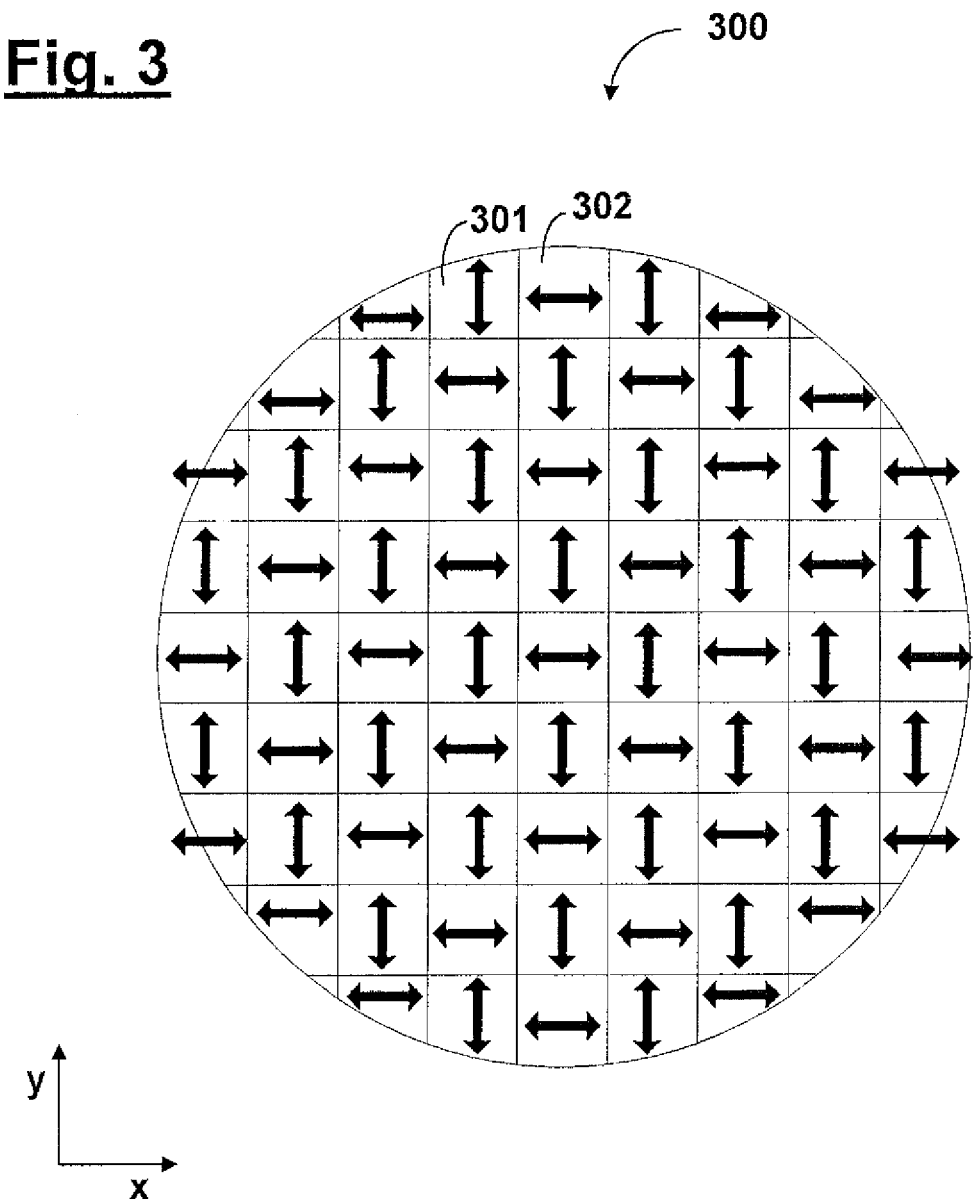
FIG. 3 shows a diagrammatic view to illustrate the structure of a polarization manipulator in accordance with an embodiment, which is used in an optical system according to the disclosure.

Referring to FIG. 3 the polarization manipulator 300 has a raster (or segmented or facet-shaped) arrangement including individual manipulator elements. The arrangement is such that adjacent manipulator elements (for example the manipulator elements 301, 302) influence differently the polarization state of light incident on the respective manipulator elements.

The configuration of the polarization manipulator 300 can be along the lines for example of the concept described in U.S. Pat. No. 6,191,880 B1, in which a raster is formed from half-wave plates including birefringent material. In that case therefore the manipulator elements are each made from birefringent material with transmission properties which are adequate at the working wavelength used (for example 193 nm). A suitable birefringent material is for example magnesium fluoride ($MgF_2$). In that respect the double-headed arrows in the FIG. 3 embodiment symbolize the polarization direction. The variation in the polarization direction over the area of a single manipulator element, the width of which can typically be for example between 10 and 20 mm, is constant. Basically, the polarization rotation achieved is sensitive to the azimuthal orientation of the manipulator elements, in which respect each manipulator element can be made up of two lambda/2 plates oriented at ±45° relative to the polarization direction of the incident light (to produce a so-called 90° rotator).

In addition the configuration of the polarization manipulator 300 can also be implemented when making use of optical activity by the manipulator elements each being made from optically active material, in particular crystalline quartz with an optical crystal axis oriented in parallel relationship with the light propagation direction or the optical system axis. In that case the optically active material produces rotation of the polarization direction, which is proportional to the distance respectively covered within the optically active material so that the thickness of the respective manipulator element determines the polarization rotation. Unlike the above-described embodiment (utilizing linear birefringence), when utilizing optical activity (that is to say circular birefringence) the azimuthal orientation of the manipulator elements is not relevant to the respectively achieved polarization rotation.

The configuration of the polarization manipulator 300 can also be along the lines of the concept described in US 2002/0176166 A1 in which there is at least one deflecting structure provided on a plate of birefringent material with a crystal axis parallel to the optical system axis, wherein the structure can be provided in the form of a diffractive structure in the form of a for example linear grating, in the form of a refractive structure in the manner of a Fresnel surface or in the form of a deflecting structure in the nature of a hologram. Furthermore the configuration of the polarization manipulator 300 can also be along the lines of the concept described in US 2004/0184019 A1 in which a reflective retardation arrangement having a plurality of retardation zones with differing retardation effect is used.

In general birefringence in the manipulator elements can also be implemented using another optically uniaxial crystalline material than $MgF_2$, for example lanthanum fluoride ($LaF_3$), sapphire ($Al_2O_3$) or crystalline quartz ($SiO_2$) with a crystal axis that is not parallel to the light propagation direction, by using a cubically crystalline material which is put under compressive or tensile stress (for example $CaF_2$, $BaF_2$, $LiBaF_3$, $Lu_3Al_5O_{12}$, $Y_3Al_5O_{12}$ or $MgAl_2O_4$), or by using an amorphous material which is put under compressive or tensile stress (for example quartz glass ($SiO_2$)). The variation in the compressive or tensile strength can also itself be used at least partially for manipulation of polarization (for example to match the manipulator elements to each other).

The manipulator elements can be stationary in the raster arrangement shown in FIG. 3 and also individually variable in their position (for example by way of actuators that are not shown). In the latter case the manipulator elements can be adapted to be variable in particular with respect to the following degrees of freedom: displacement in a direction perpendicular to the optical axis; displacement along the optical axis; rotation about an axis parallel to the optical axis, in which case the axis can both coincide with the optical axis or be different therefrom; and rotation about an axis which is not parallel to the optical axis (tilting movement) and which can (but does not have to) extend through the center of the element, if such a center is distinguished.

Further embodiments of the disclosure concern a switchable configuration of the manipulator, in particular using Kerr or Pockels cells, as described hereinafter with reference to FIG. 8 and following.

Hereinafter without restriction of the generality it is now assumed that the laser light incident on the polarization manipulator 300 is originally linearly polarized in the y-direction and that polarization direction remains unchanged in the regions 301 of the polarization manipulator 300, whereas it is rotated through 90° in the regions 302 (corresponding to an action on the part of those regions as a lambda/2 plate). If therefore a beam portion is incident on one of the mirrors of the mirror arrangement 200 then the polarization manipulator 300 thus either leaves the polarization direction of that beam portion unchanged or it rotates it through an angle of 90°, depending on the tilt angle currently set for that mirror.

Figure 4A:
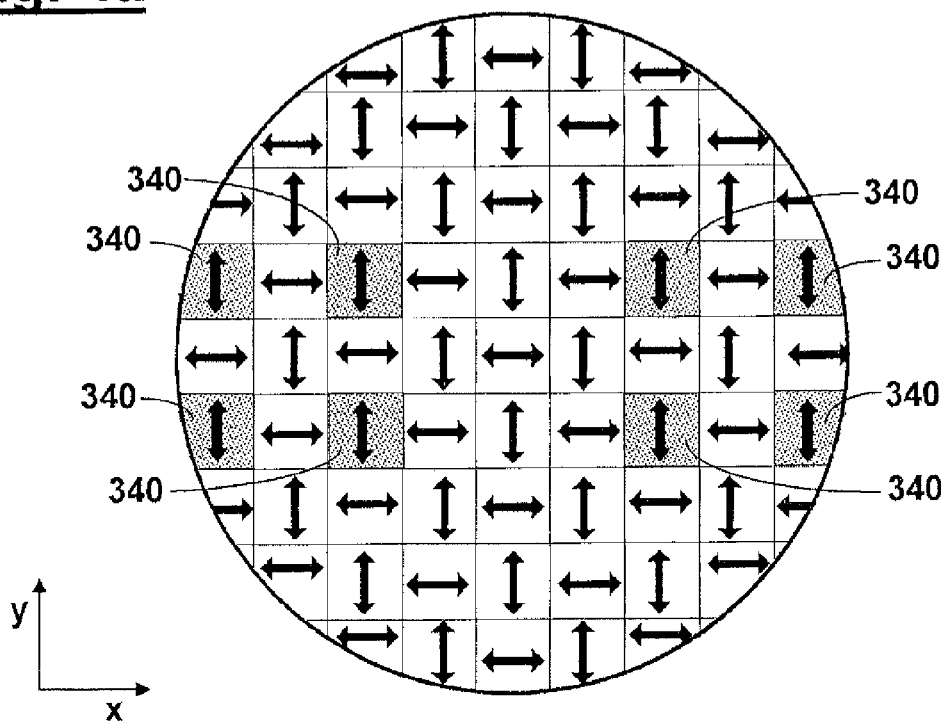
FIGS. 4*a*-5*b* show diagrammatic views to illustrate the adjustment of different illumination settings according to the disclosure.
Figure 4B:
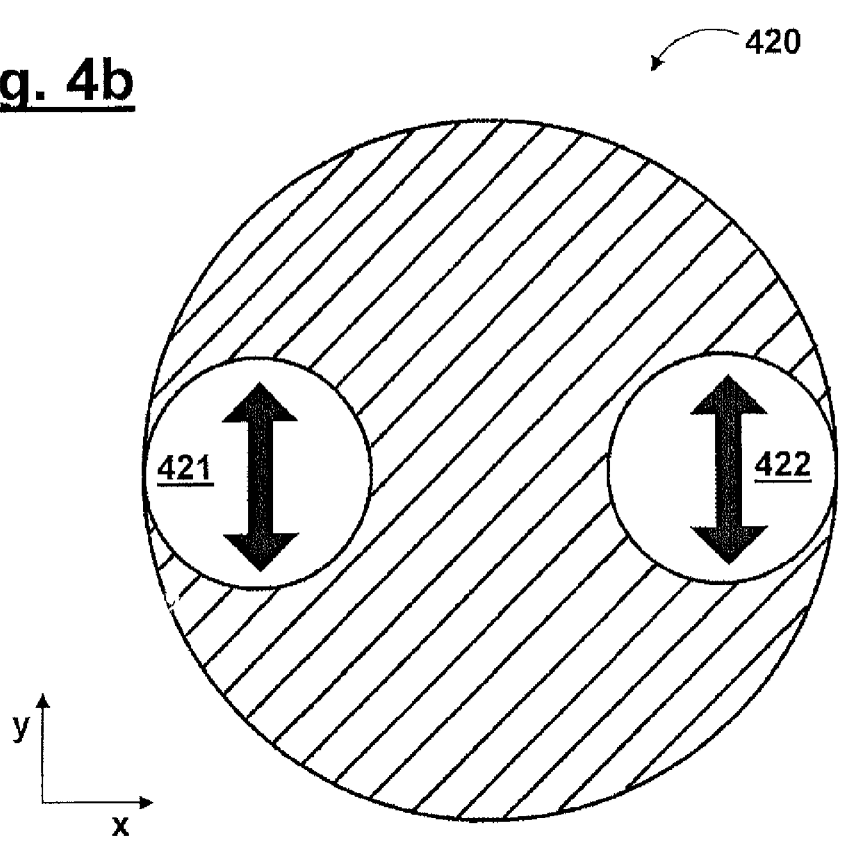

Referring to FIG. 4a the mirror elements 200a, 200b, 200c, . . . of the mirror arrangement 200 can in particular be so set that the overall illumination light is deflected on to the manipulator elements 340 of the polarization manipulator 300. The non-dotted region corresponds to the region in the pupil plane, which is not illuminated but which can still be illuminated beside the illuminated regions (shown dotted). The beam portions deflected on to the manipulator elements 340 of the polarization manipulator 300 still have a polarization direction in the y-direction when issuing from the polarization manipulator 300. The illumination setting 420 set in that way is of such a nature as shown in FIG. 4b that in the pupil plane PP, only the regions 421 and 422 which are in mutually opposite relationship in the x-direction in the illustrated co-ordinate system (that is to say horizontally) and which can also be referred to as illumination poles are illuminated and the light is polarized in the y-direction in those regions. That illumination setting 420 is also referred to as a "quasi-tangentially polarized H-dipole illumination setting".

Figure 5A:
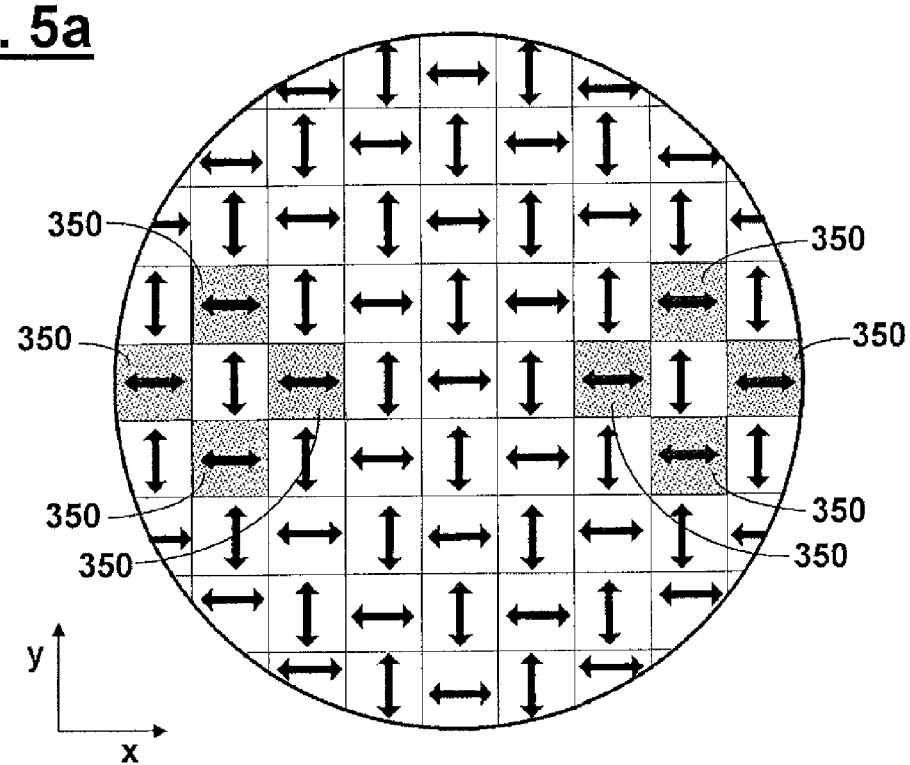
Figure 5B:
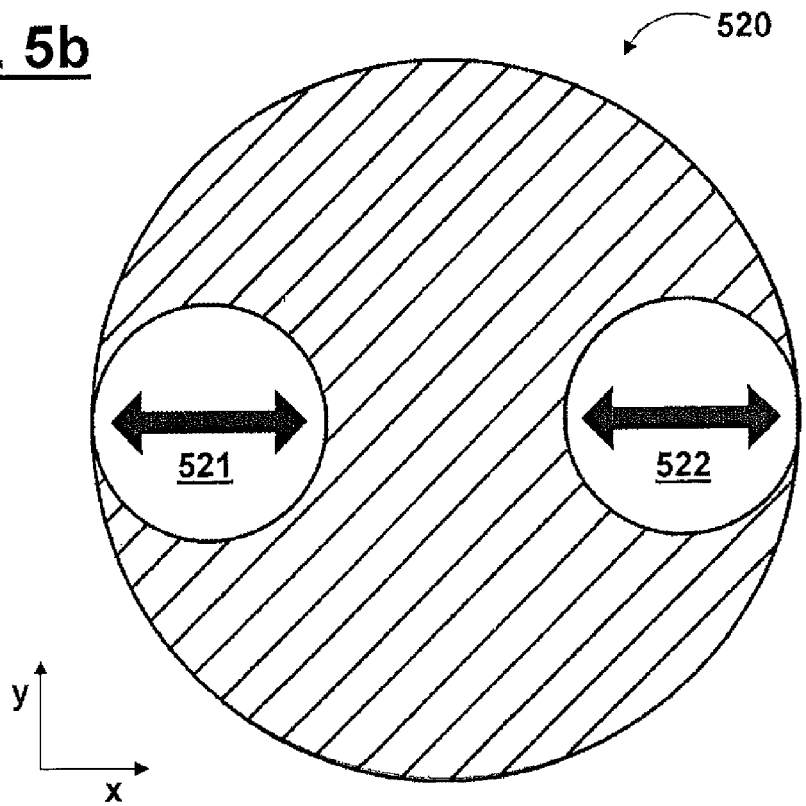

In addition as shown in FIG. 5a the mirror elements 200a, 200b, 200c, . . . of the mirror arrangement may also be set in such a way that all the illumination light is deflected on to the manipulator elements 350 of the polarization manipulator 300. The non-dotted region again corresponds to the region in the pupil plane, which is not illuminated but which can still be illuminated beside the regions illuminated (shown dotted). The beam portions deflected on to the manipulator elements 350 of the polarization manipulator 300 have a polarization direction in the x-direction on issuing from the polarization manipulator 300. The illumination setting 520 set in that way is of such a nature as shown in FIG. 5b that in the pupil plane PP only the regions 521 and 522 in mutually opposite relationship in the x-direction in the illustrated co-ordinate system (that is to say horizontally) are also illuminated, but unlike FIG. 4b the light in those regions is polarized in the x-direction. That illumination setting 520 can also be referred to as a "quasi-radially polarized H-dipole illumination setting".

In that respect the expression "tangential polarization distribution" is used generally to denote a polarization distribution in which the vibration direction of the electric field strength vector extends perpendicularly to the radius directed towards the optical system axis. Accordingly reference is made to a "quasi-tangential polarization distribution" when the foregoing condition is fulfilled approximately or for individual regions in the plane in question (for example the pupil plane), as in the example of FIG. 4a for the regions 421 and 422. Accordingly the expression "radial polarization distribution" is used generally to denote a polarization distribution in which the vibration direction of the electric field strength vector extends parallel to the radius directed towards the optical system axis. Accordingly reference is made to a "quasi-radial polarization distribution" when the foregoing condition is fulfilled approximately or for individual regions in the plane in question, as in the example of FIG. 5a for the regions 521 and 522.

Now in particular flexible and rapid switching-over between the illumination settings 420 and 520 can be achieved by suitable displacement of the mirror elements 200a, 200b, 200c, . . . by way of the actuation unit 105, such displacement being matched to the raster arrangement of the manipulator elements of the polarization manipulator 300.

Similarly to the examples of FIGS. 4 and 5, in addition the mirror elements 200a, 200b, 200c, . . . of the mirror arrangement 200 can be adjusted for example for setting a quasi-tangentially or quasi-radially polarized V-dipole illumination setting, in such a way that they deflect all the light into the pupil plane PP exclusively on to regions in mutually opposite relationship in the y-direction, in which case it is also possible to provide for switching over between those illumination settings by corresponding displacement of the mirror elements 200a, 200b, 200c, . . . of the mirror arrangement 200.

Actuation of the mirror arrangement 200 can be effected in such a way that the system effect for the individually adjustable mirror positions is ascertained for the respective manipulator used by calculation or using calibration measurements, and that sensitivity information is used as the input for the control algorithm of the mirrors, jointly with one or more target settings which in turn can result from system measurements, or however are derived from items of information relating to the current use scenario. The algorithm used can be any optimization process sufficiently known in the state of the art (for example gradient processes, simulated cooling, genetic algorithm or combinations thereof). Optionally actuation of the mirror elements can also be coupled to any position manipulators (if present) for manipulation of the position of one or more manipulator elements.

In accordance with further embodiments the mirror arrangement 200 can also co-operate with the polarization manipulator 300 in such a way that other known illumination settings, for example a quadrupole illumination setting, are produced.

Figure 6:
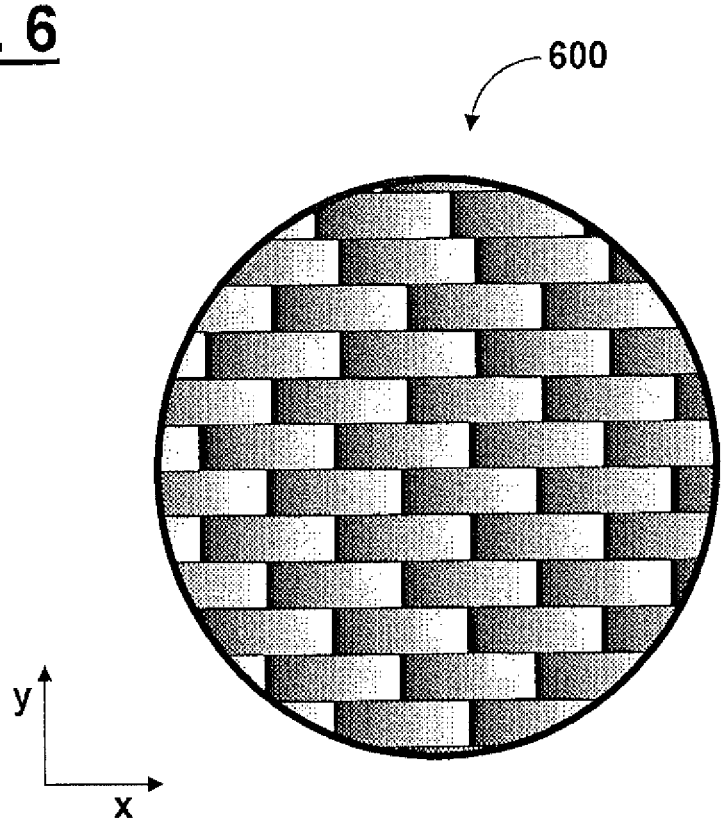
FIG. 6 shows a diagrammatic view to illustrate the structure of an intensity manipulator in accordance with an embodiment, that is used in an optical system according to the disclosure.

FIG. 6 shows a diagrammatic view of an intensity manipulator 600 which in accordance with a further embodiment of the disclosure can be used as a manipulator in the structure shown in FIG. 1. The intensity manipulator 600 has a raster arrangement of manipulator elements which in accordance with the embodiment each involve a wedge-shaped or linear transmission characteristic. For that purpose the manipulator elements can be covered with layers, the transmission or reflection capability of which laterally varies. In a further embodiment the manipulator elements can be covered with absorbent particles (for example chrome dots) of varying density. Depending on the setting of the mirror elements 200a, 200b, 200c, . . . of the mirror arrangement 200 certain positions to be illuminated can now be selected in specifically targeted fashion in that raster arrangement so that the manipulator 600 forms a variable gray filter.

Figure 7A:
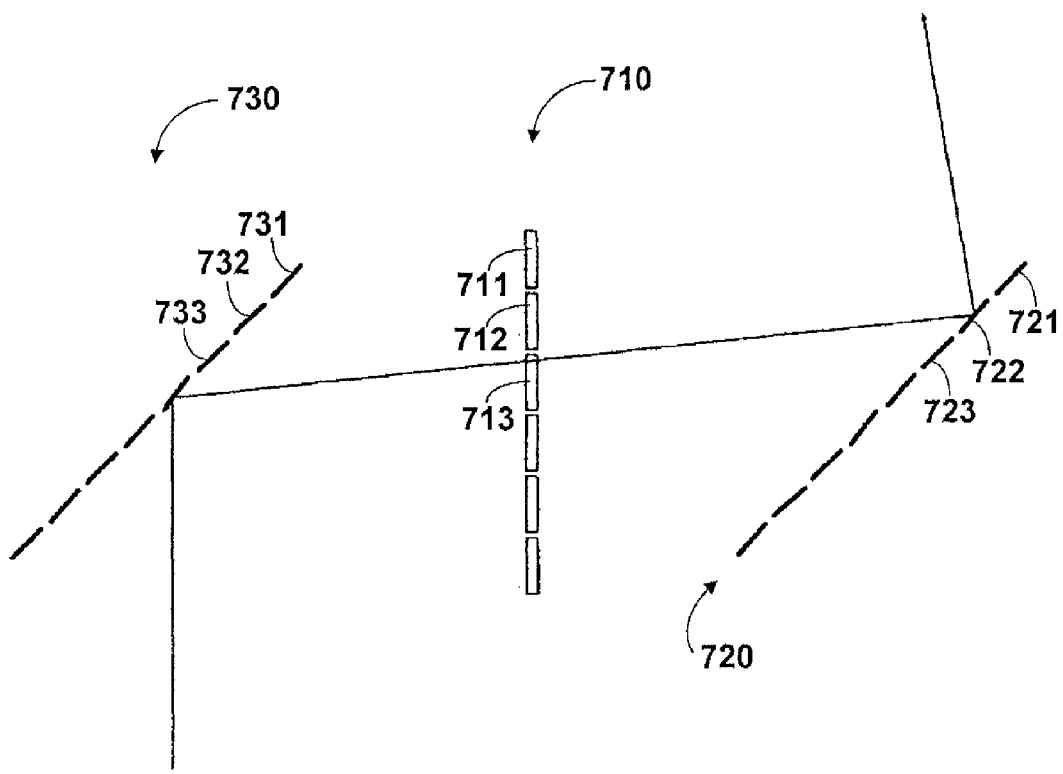
FIGS. 7*a*-11*b* show diagrammatic views to illustrate further embodiments of the disclosure.

Similarly to the above-described embodiments, the manipulator 600 can be arranged both near the pupil, which is advantageous in particular for improving uniformity, and also near the field, which is advantageous in particular for optimising the apodization characteristic. Furthermore the concept according to the disclosure can also be expanded such that an intensity manipulator of the FIG. 6 kind is combined with a position manipulator of the FIG. 3 kind FIG. 7a shows a diagrammatic view to illustrate a further embodiment in which two mirror arrangements 720 and 730, each with a plurality of mutually independently adjustable mirror elements 721, 722, 723, . . . and 731, 732, 733, . . . respectively are provided. In addition there is a manipulator 710 of a similar structure to the foregoing embodiments, having an arrangements of manipulator elements 711, 712, 713, wherein the mirror arrangement 720 is arranged downstream of the manipulator 710 with respect to the light propagation direction (extending in the z-direction) and wherein the mirror arrangement 730 is arranged upstream of the manipulator 710 with respect to the light propagation direction.

The function of the mirror elements 731, 732, . . . of the mirror arrangement 730 is to specifically targetedly deflect the individual light rays on to selected manipulator elements 711, 712, . . . so that the desired polarization state or the desired intensity is "imposed" on those light rays depending on the respective configuration of the manipulator element in question. The second mirror arrangement 720 then performs the function of deflecting the light rays in question which have the respectively desired polarization state and/or the desired intensity to a position which can also be freely selected in the pupil plane and thus implement the light distribution in the pupil plane. In this configuration therefore both the polarization state or intensity and also the location to be illuminated in the pupil plane can be selected for each of the light rays independently of each other and freely so that this achieves a high degree of flexibility in regard to setting the desired illumination setting.

The foregoing comments in connection with the other embodiments by way of example correspondingly apply in regard to the configuration of the manipulator elements 711, 712, . . . . In particular the manipulator elements can be assembled to afford a periodically alternating arrangement of regions which differently influence the polarization state and/or intensity of the respectively incident light. A polarization-influencing effect can be achieved both by filtering (for example by way of Brewster prisms) or by altering or rotating the polarization state (via retarding elements or utilizing optical activity).

Figure 7B:
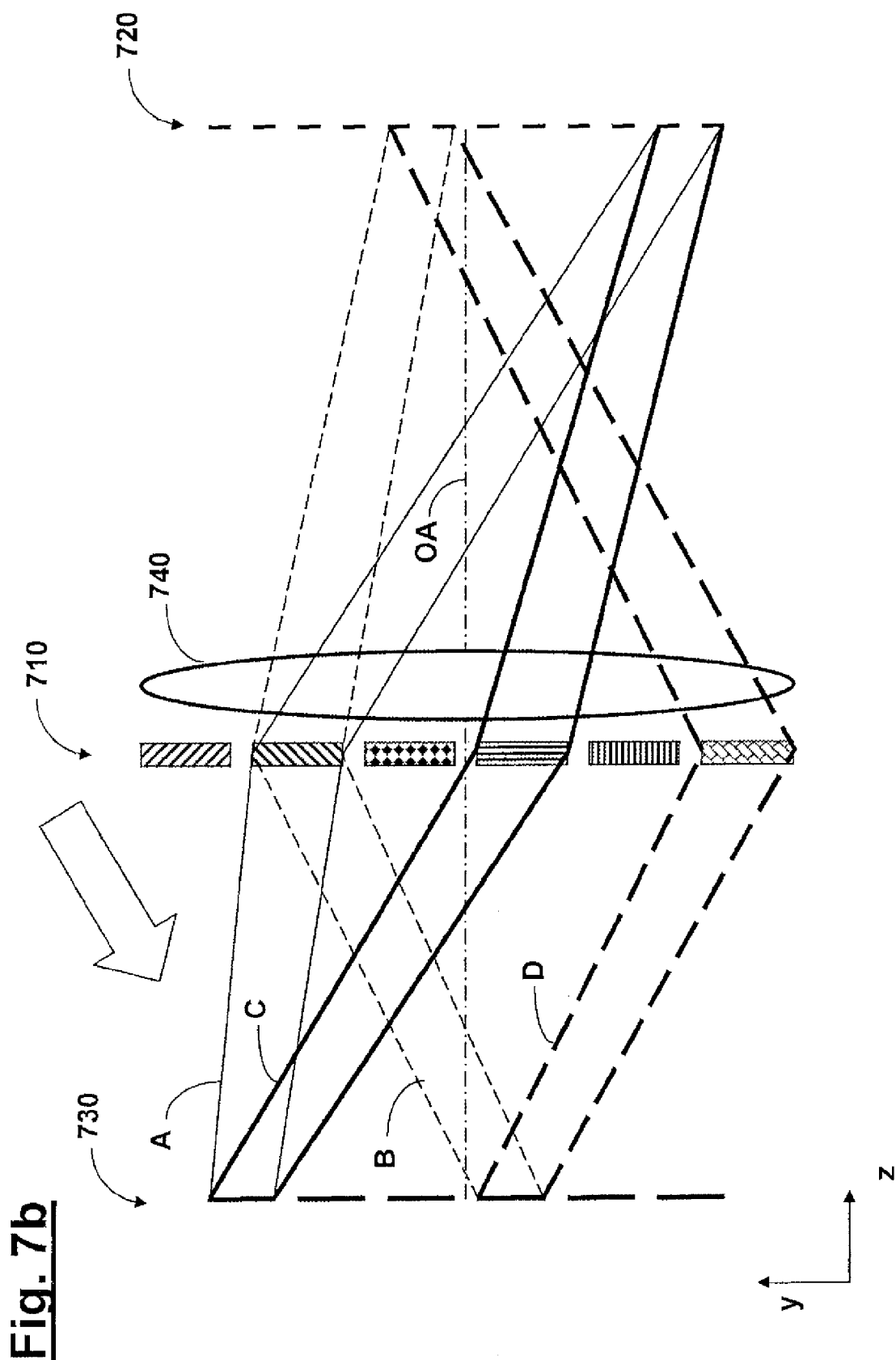

Referring to FIG. 7b arranged between the manipulator 710 with an arrangement of manipulator elements 711, 712, 713, . . . and the second mirror arrangement 720 is an optical imaging arrangement or relay optical arrangement 710 imaging the mirror elements of the first mirror arrangement 730 on to the mirror elements of the second mirror arrangement 720. The number N of the mirror elements of the first mirror arrangement can then be selected to be smaller and possibly also substantially smaller than the number M of the mirror elements of the second mirror arrangement 720 (that is to say N≤M, possibly even N<<M). In that case the number N of the mirror elements of the first mirror arrangement 730 determines how many different polarization states can be produced simultaneously in the illumination pupil. A greater value of N in comparison with M is also not out of the question in accordance with the disclosure.

For dynamic setting of the polarization states which vary from one illumination setting to another the manipulator 710 with the arrangement of manipulator elements 711, 712, 713, . . . (in the form of polarization-optical faceted elements) can be adapted to be switchable, as will be described in greater detail hereinafter with reference to FIG. 8 ff. Besides the advantages still to be described of such a dynamic configuration the arrangement of FIGS. 7a-b enjoys the further advantage that a smaller number of mirror elements is used to achieve substantially comparable flexibility than in the case of a non-switchable design configuration for the manipulator. In the last-mentioned case of the non-switchable design configuration for the manipulator the number N of the mirror elements of the first mirror arrangement 730 then determines the number of all polarization states which can occur overall in a pupil plane of the illumination system or the illumination pupil.

The optical imaging arrangement (or relay optical arrangement) 710 produces an image of a respective mirror element of the first mirror arrangement 730 on m associated mirror elements of the second mirror arrangement 720, in which case preferably the relationship m*N=M is met (wherein m is a natural number or a whole number greater than zero). That is based on the consideration that the image of a mirror of the first mirror arrangement 730 advantageously just fits on to a (whole) number of mirrors of the second mirror arrangement 720. In that respect further preferably the transition (or the "edge") between the images of two mirrors of the first mirror arrangement 730, that are produced by the first mirror arrangement 730, should not come to lie on a mirror of the second mirror arrangement 720. That provides that each mirror of the second mirror arrangement 720 is acted upon with a defined polarization state—and not for example with two or more mutually different polarization states.

Referring to FIG. 7b, one and the same mirror element of the first mirror arrangement 730 is always imaged by the optical imaging arrangement 710 on to the same mirror element or elements of the second mirror arrangement 720 in dependence on which channel of the manipulator 710 is involved (in FIG. 7b that can be seen for the beam paths A and C on the one hand and the beam paths B and D on the other hand). In other words the association between the mirror elements of the first and second mirror arrangements 730, 720 is fixedly predetermined by the optical imaging arrangement 710. The optical imaging arrangement 710 itself represents a projection objective (affording a point-to-point imaging implementation), of which only one lens is diagrammatically shown for the sake of simplicity, and it has basically any imaging scale, in which case that imaging scale is suitably adapted to the possibly differing size of the first and second mirror arrangements or the mirror elements disposed therein (that is to say the imaging scale is typically so selected that in magnitude it corresponds to the ratio of the sizes of the first and second mirror arrangements 730, 720).

The setting of the respective tilt angle in the first mirror arrangement 730 serves to establish which "channel" of the manipulator 710 (that is to say of the faceted polarization-optical element) is involved. The polarization is then deflected in conformity with the desired intensity distribution to the corresponding co-ordinates in the illumination pupil by way of the setting of the respective tilt angle in the second mirror arrangement 720.

In that respect (as indicated in FIG. 7b via beam paths A, B) different regions of the first mirror arrangement 730 can be associated with the same manipulator element 711, 712, 713, . . . (that is to say they use the same channel), as is illustrated in FIG. 7b by reference to the beam paths "A" and "B", in which respect in particular also all individual mirrors of the first mirror arrangement 730 can use the same channel. On the other hand, different regions of the first mirror arrangement 730 can also be associated with different manipulator elements 711, 712, 713, . . . (that is to say they use different channels), as is indicated in FIG. 7b by reference to the beam paths "C" and "D".

A further embodiment of the present disclosure is described hereinafter with reference to FIGS. 8-10. In this embodiment channel-wise adjustment of polarization is made possible by virtue of the fact that, as can be seen from FIG. 9, in addition to a mirror arrangement 920 having a plurality of mirror elements, there is a manipulator 910 which has a raster-type or matrix-type arrangement of cells which permit flexible dynamic switching-over of polarization and which in the illustrated embodiment are in the form of Kerr cells. In FIG. 9 the manipulator 910 is arranged downstream of the mirror arrangement 920 in the light propagation direction and represents in particular the optical element next following in the light propagation direction relative to the mirror arrangement 920.

Each of the Kerr cells in the manipulator 910 permits controllable modulation of the polarization of the light passing therethrough in per se known manner by way of a variation in an electric field applied from the exterior. In a further embodiment the cells can also be in the form of Pockels cells which are produced from a suitable crystal material with transmission which is adequate at the working wavelength (for example KDP=potassium dihydrogen phosphate, $KH_2PO_4$) and permit polarization manipulation on the basis of the linear proportionality of the birefringence in the crystal material relative to the electric field applied from the exterior.

The configuration of the manipulator 910 with the plurality of Kerr cells (or Pockels cells) can also be a periodic or also a non-periodic arrangement, wherein in particular the dimensions of the individual Pockels cells within the manipulator 910 can also vary over the optically used region of the manipulator 910. Furthermore the individual Pockels cells can be of a square, rectangular or also other suitable geometry with respect to their optically used effective area. Preferably the geometrical arrangement of the Kerr cells in the manipulator 910 is so matched to the mirror arrangement 920 that shadowing effects are minimised or optimum transmission is achieved by the optical assembly formed from the manipulator 910 and the mirror arrangement 920.

Although in principle each individual mirror element of the mirror arrangement 920 may have its own associated Kerr cell (or Pockels cell) within the manipulator 910 associated therewith, embodiments of the disclosure can provide that a plurality of mirror elements are associated cluster-wise with the same Kerr cell (or Pockels cell) within the manipulator 910 so that the light reflected by the mirror elements of one and the same cluster is respectively acted upon with light of the same polarization. If just by way of example the basic starting point is a total number of 4000 mirror elements in the mirror arrangement, then for example (without the disclosure being restricted thereto) respective clusters with of the order of magnitude of 50 mirror elements can be associated with the same Kerr cell or Pockels cell and thus after reflection at the mirror elements the light is acted upon with the same polarization state, wherein depending on the respective actuation of the individual Kerr cells or Pockels cells mirror elements in adjacent clusters can be acted upon with different polarization states.

Figure 8:
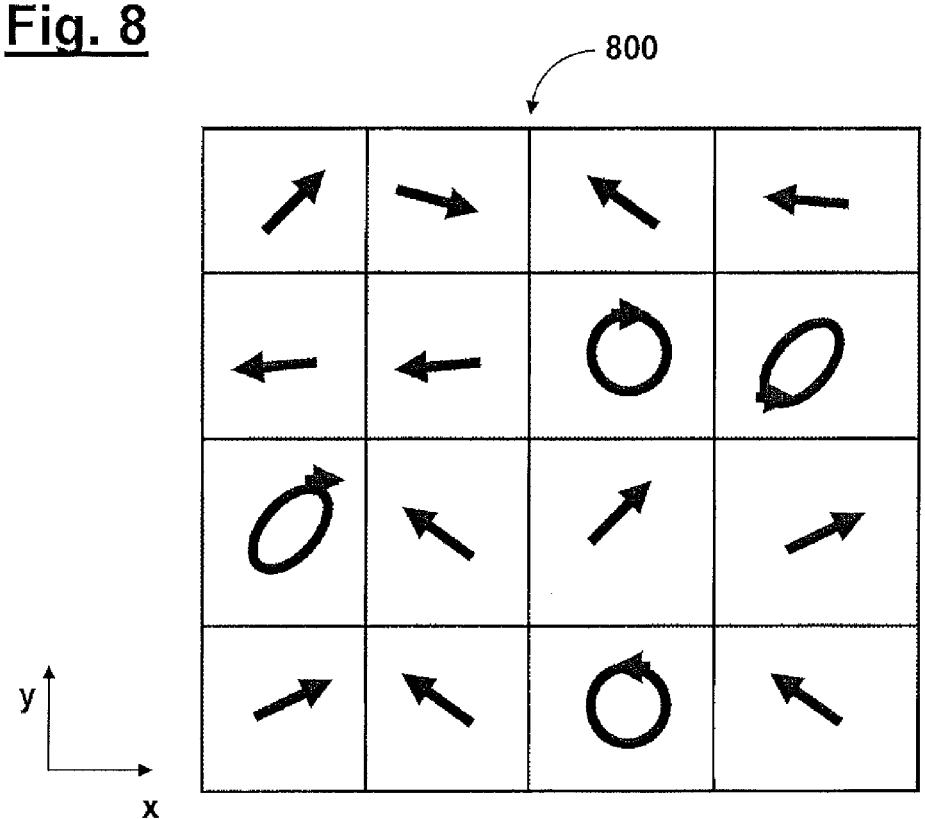
Figure 9:
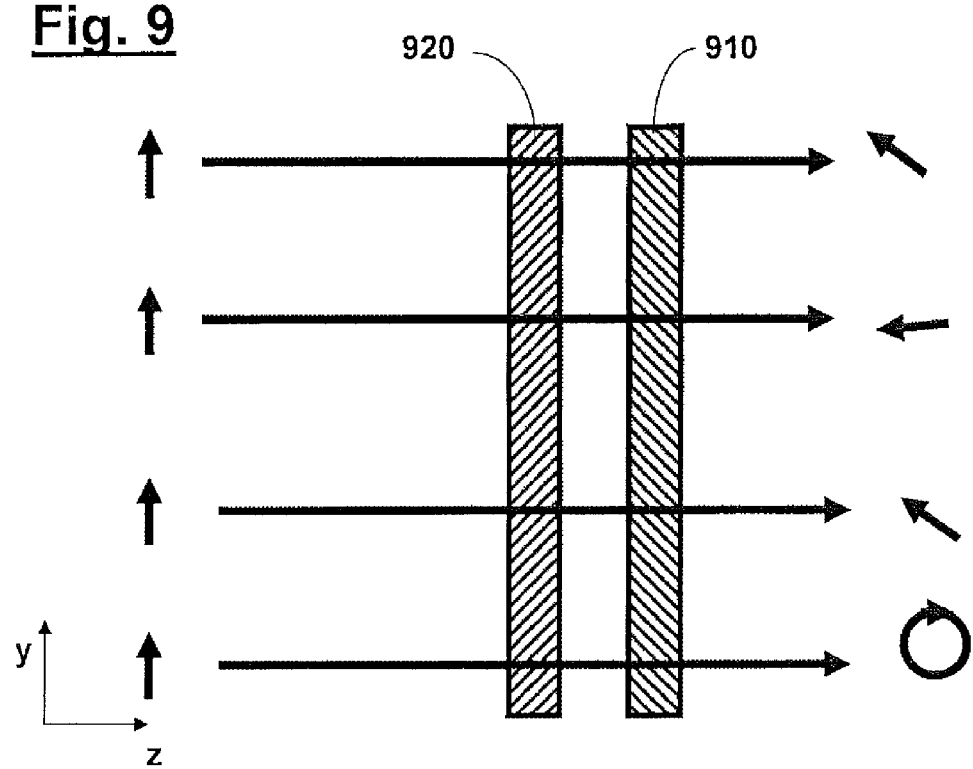
Figure 10:
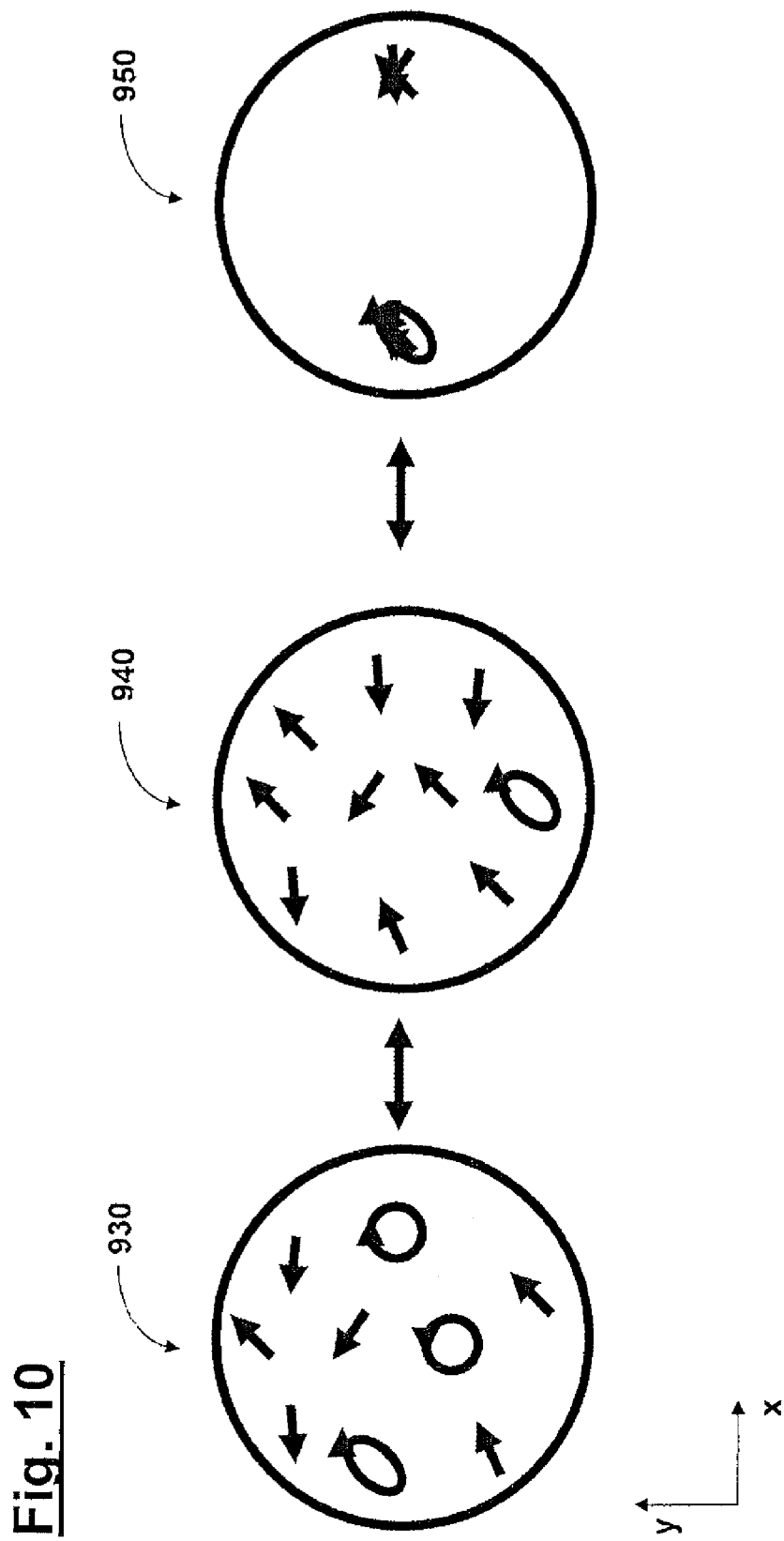

A substantial advantage of the embodiment shown in FIGS. 8 and 9 is that, with respect to dynamic switching-over of the polarization state, that is possible due to variable actuation of the Kerr cells or Pockels cells, the switching-over times which can be achieved are very short (they can be in particular less than 1 second) and can thus be adapted to the change, which can be implemented by the mirror arrangement 920, in intensity distribution or the illumination setting (which can also typically involve less than 1 second). Thus according to the disclosure there is the possibility of switching over dynamically between different illumination settings which differ from each other in intensity distribution and/or polarization distribution in rapid succession by virtue of mutually matched or co-ordinated actuation of the manipulator 910 on the one hand and the mirror arrangement 920 on the other hand.

FIG. 8 shows in that respect a merely diagrammatic view showing a polarization distribution which is possible by way of example and which is achieved immediately after the light passes through the manipulator 910 and with which the light can be acted upon after reflection at the individual mirror elements (or clusters of mirror elements) of the mirror arrangement 920. Using suitable mutually matched actuation of the manipulator 910 on the one hand and the mirror arrangement 920 on the other hand it is possible for example with the above-mentioned switching times, as shown in FIG. 10, to switch over between different illumination settings 930, 940, 950, . . . .

A further example of application of the above-described embodiment provides that, by suitable actuation of the Kerr cells or Pockels cells in the manipulator 910 on the one hand and the mirror arrangement 920 on the other hand it is possible at least in individual regions of the pupil plane to achieve incoherent superpositioning of various polarization states, which as a result leads to unpolarized light in those regions. For that purpose then individual regions or cells of the light bundle produced by the laser light source, which are associated with different "coherence cells" and are thus no longer coherent relative to each other are deflected by the mirror arrangement 920 on to the same region within the pupil plane and acted upon with different polarization states by suitable actuation of the manipulator 910 to produce incoherent superpositioning. At the same time a defined preferential polarization direction can further be produced via the other Kerr cells or Pockels cells within the manipulator 910 and the mirror elements within the mirror arrangement 920 in other regions or illumination poles of the pupil plane so that in that way mixed polarized/unpolarized illumination settings can be produced.

Figure 11A:
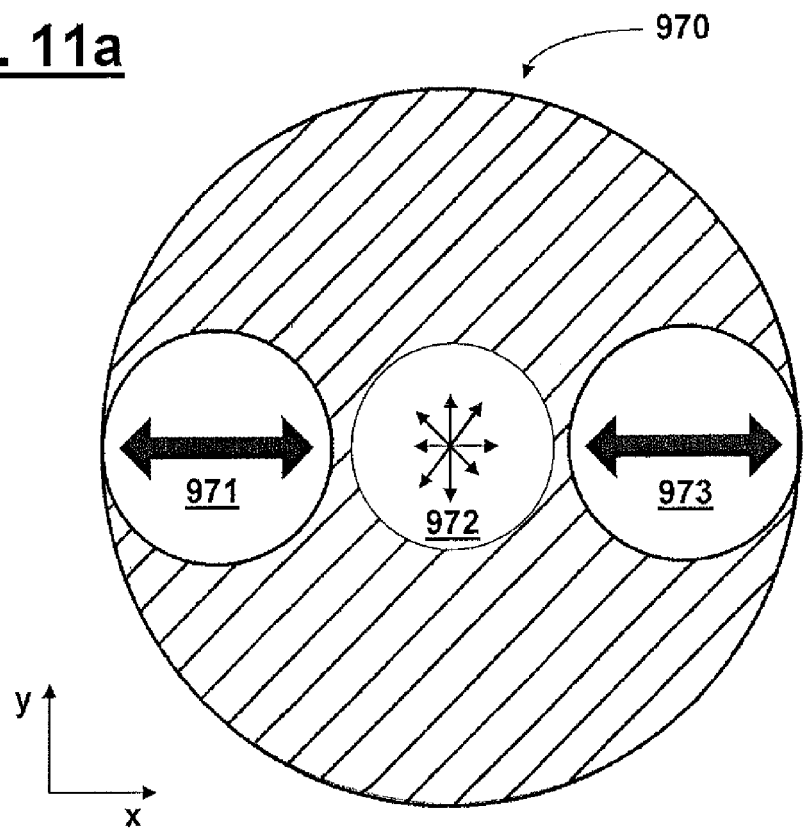

An example of this is shown in FIG. 11*a* in which an illumination setting 970 includes a combination of a dipole setting with a quasi-radial polarization distribution (in the illumination poles 971 and 973 in mutually opposite relationship in the x-direction) and an unpolarized illumination setting (having a circular region or illumination pole 972 in the center of the pupil plane, also referred to as the "low sigma setting" which is illuminated with unpolarized light).

The disclosure permits in particular the setting (possibly also dynamically switchable) of illumination settings which are at least region-wise unpolarized without a separate depolarizer being desired for that purpose.

Figure 11B:
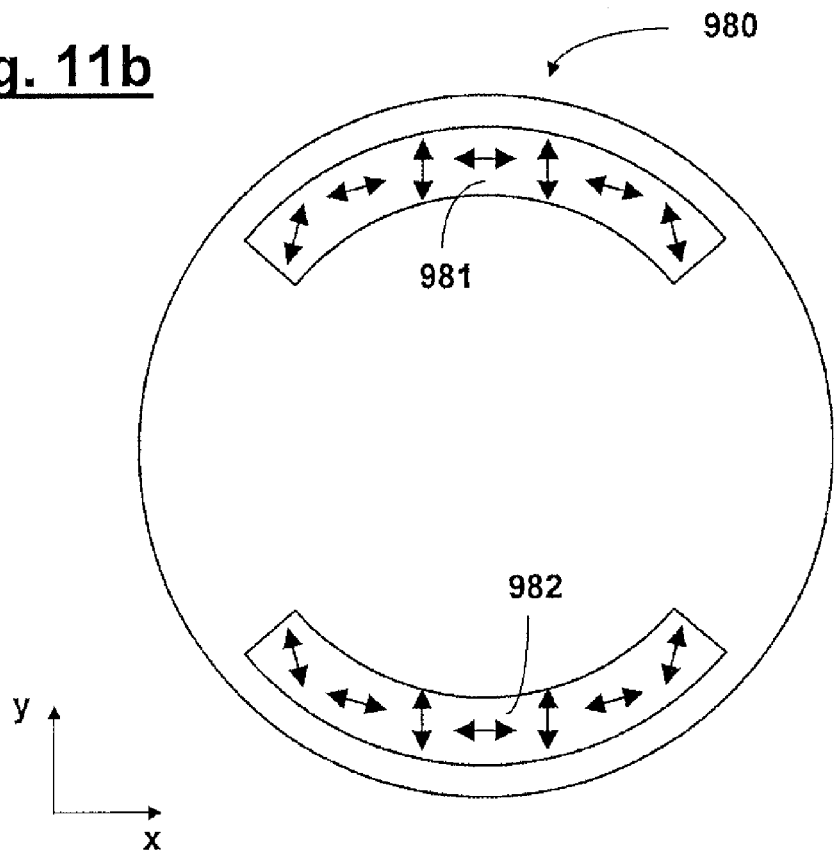

A further example of an adjustable illumination setting according to the disclosure is shown in FIG. 11*b* in which an illumination setting 980 is produced in the form of a dipole setting with two illumination poles 981, 982 arranged in mutually opposite relationship in the y-direction, wherein the preferential polarization direction is respectively varied over the individual illumination poles 981, 982 (in the illustrated embodiment the vibration direction of the electric field strength vector extends within one and the same illumination pole in region-wise manner in the x-direction and also in region-wise manner in the y-direction, that is to say mutually perpendicular preferential polarization directions are produced in one and the same illumination pole).

Even if the disclosure has been described using specific embodiments numerous variations and alternative embodiments will be apparent to the man skilled in the art, for example by the combination and/or exchange of features of individual embodiments. Accordingly a person skilled in the art will appreciate that such variations and alternative embodiments are also embraced by the present disclosure and the scope of the disclosure is limited only in the sense of the accompanying claims and equivalents thereof.

The invention claimed is:

1. An optical system having a pupil plane, the optical system comprising:
  a mirror arrangement comprising a plurality of mirror elements which are displaceable independently of each other to alter an angular distribution of light reflected by the mirror arrangement during use of the optical system; and
  a manipulator downstream of the mirror arrangement along a light propagation path through the optical system, the manipulator comprising a raster arrangement of manipulator elements configured so that light interacting with the manipulator during use of the optical system is influenced differently in its polarization state and/or in its intensity depending on an incidence location of the light on the manipulator,
  wherein:
    when the mirror elements are arranged in a first configuration, light reflected by the mirror arrangement results in a first illumination setting in the pupil plane;

when the mirror elements are arranged in a second configuration, light reflected by the mirror arrangement results in a second illumination setting in the pupil plane;

the first and second illumination settings illuminate identical regions of the pupil plane;

a polarization state of the light in the pupil plane in the first illumination setting is different from a polarization state of the light in the pupil plane in the second illumination setting;

the raster arrangement of manipulator elements has an arrangement of regions which differently influence the polarization state and/or the intensity of light that interacts with the manipulator elements;

the arrangement of regions alternates periodically in two perpendicular spatial directions;

a period length of the periodically alternating arrangement in a given spatial direction corresponds to a period length of the mirror arrangement in that spatial direction or to an integral multiple of the period length in that spatial direction; and the optical system is configured to be used in a microlithographic projection exposure apparatus.

2. The optical system of claim 1, wherein a maximum extent of the manipulator elements in one of the two perpendicular spatial directions is at most one tenth of a maximum extent of the optically usable area of the manipulator in that spatial direction.

3. The optical system of claim 2, wherein the mirror arrangement is at a first position of the optical system, the manipulator is at a second position of the optical system, and a paraxial subaperture ratio of the first position differs from a paraxial subaperture ratio of the second position by at most 0.15.

4. The optical system of claim 2, wherein the mirror arrangement is at a position in the optical system having a paraxial subaperture ratio greater than 0.8, and/or the manipulator is arranged at a position in the optical system having a paraxial subaperture ratio greater than 0.8.

5. The optical system of claim 2, wherein the mirror arrangement is at a position in the optical system having a paraxial subaperture ratio less than 0.3, and/or the manipulator is arranged at a position in the optical system having a paraxial subaperture ratio less than 0.3.

6. The optical system of claim 2, further comprising a second mirror arrangement comprising a plurality of mirror elements displaceable independently of each to alter an angular distribution of the light reflected by the second mirror arrangement, wherein the manipulator is between the mirror arrangements along the light propagation path.

7. The optical system of claim 2, wherein, during use of the optical system, mutually adjacent manipulator elements produce mutually orthogonal polarization states for light that interacts with the manipulator.

8. The optical system of claim 2, wherein the manipulator elements are configured so that the manipulator elements mutually cancel each other in their influence on the polarization state when the entire optically usable area of the manipulator is illuminated during use of the optical system.

9. The optical system of claim 2, wherein at least two mutually different illumination settings are adjustable by varying an angular distribution of the light reflected by the mirror arrangement.

10. The optical system of claim 2, further comprising an actuation unit to actuate a displacement of the mirror elements.

11. The optical system of claim 2, wherein at least two different dipole illumination settings are adjustable with mutually orthogonal polarization states.

12. The optical system of claim 2, wherein at least one illumination setting is adjustable with an at least approximately tangential polarization distribution or an at least approximately radial polarization distribution.

13. The optical system of claim 2, wherein the manipulator elements comprise gray filters.

14. The optical system of claim 1, wherein the mirror arrangement is at a first position of the optical system, the manipulator is at a second position of the optical system, and a paraxial subaperture ratio of the first position differs from a paraxial subaperture ratio of the second position by at most 0.15.

15. The optical system of claim 1, wherein the mirror arrangement is at a position in the optical system having a paraxial subaperture ratio greater than 0.8, and/or the manipulator is arranged at a position in the optical system having a paraxial subaperture ratio greater than 0.8.

16. The optical system of claim 1, wherein the mirror arrangement is at a position in the optical system having a paraxial subaperture ratio less than 0.3, and/or the manipulator is arranged at a position in the optical system having a paraxial subaperture ratio less than 0.3.

17. The optical system of claim 1, further comprising a second mirror arrangement comprising a plurality of mirror elements displaceable independently of each to alter an angular distribution of the light reflected by the second mirror arrangement, wherein the manipulator is between the mirror arrangements along the light propagation path.

18. The optical system of claim 1, wherein, during use of the optical system, mutually adjacent manipulator elements produce mutually orthogonal polarization states for light that interacts with the manipulator.

19. The optical system of claim 1, wherein the manipulator elements are configured so that the manipulator elements mutually cancel each other in their influence on the polarization state when the entire optically usable area of the manipulator is illuminated during use of the optical system.

20. The optical system of claim 1, wherein at least two mutually different illumination settings are adjustable by varying an angular distribution of the light reflected by the mirror arrangement.

21. The optical system of claim 1, further comprising an actuation unit to actuate a displacement of the mirror elements.

22. The optical system of claim 1, wherein at least two different dipole illumination settings are adjustable with mutually orthogonal polarization states.

23. The optical system of claim 1, wherein at least one illumination setting is adjustable with an at least approximately tangential polarization distribution or an at least approximately radial polarization distribution.

24. The optical system of claim 1, wherein the manipulator elements comprise gray filters.

25. The optical system of claim 1, wherein at least some of the manipulator elements have a different reflectivity for the light or a different transmissivity for the light.

26. An apparatus, comprising:
an illumination system comprising an optical system according to claim 1; and
a projection objective,
wherein the apparatus is a microlithographic projection exposure apparatus.

27. A method, comprising:
using an illumination system of a microlithographic projection exposure apparatus to illuminate a mask comprising structures; and
using a projection objective of the microlithographic projection exposure apparatus to project the structures of the mask onto a light-sensitive material,
wherein the microlithographic projection exposure apparatus comprises an optical system according to claim 1.

* * * * *

UNITED STATES PATENT AND TRADEMARK OFFICE
CERTIFICATE OF CORRECTION

PATENT NO. : 9,946,161 B2
APPLICATION NO. : 13/660146
DATED : April 17, 2018
INVENTOR(S) : Ingo Saenger et al.

It is certified that error appears in the above-identified patent and that said Letters Patent is hereby corrected as shown below:

In the Specification

Column 12, Line 39, after "kind" insert -- . --.

Signed and Sealed this
Twenty-eighth Day of August, 2018

Andrei Iancu
*Director of the United States Patent and Trademark Office*